United States Patent [19]
Cathey

[11] Patent Number: 5,260,517
[45] Date of Patent: Nov. 9, 1993

[54] INTERCONNECT LEAD WITH STRESS JOINT

[75] Inventor: David A. Cathey, Boise, Id.

[73] Assignee: Micron Technology, Inc., Boise, Id.

[21] Appl. No.: 942,951

[22] Filed: Sep. 9, 1992

[51] Int. Cl.[5] .............................................. H05K 1/00
[52] U.S. Cl. .................................. 174/250; 174/126.3; 361/772
[58] Field of Search ...................... 174/250, 257, 126.2, 174/126.3; 361/404, 406, 408, 414

[56] References Cited

U.S. PATENT DOCUMENTS 4,606,788  8/1986  Moran ................................ 174/257
4,899,439  2/1990  Potter et al. .

Primary Examiner—Leo P. Picard
Assistant Examiner—Cheryl R. Figlin
Attorney, Agent, or Firm—Stoel Rives Boley Jones & Grey

[57] ABSTRACT

An interconnect lead (12) has trenches (28) that function as stress joints to inhibit the formation of stress related defects, such as cracks and hillocks. The interconnect lead is formed by a continuous layer (18) of a refractory metal alloy and a segmented layer (22) of an aluminum alloy. The stress joints are formed by using a high resolution microlithographic process (48) to etch the narrow trenches in a transverse direction to the length of the conductor through the aluminum layer.

10 Claims, 2 Drawing Sheets

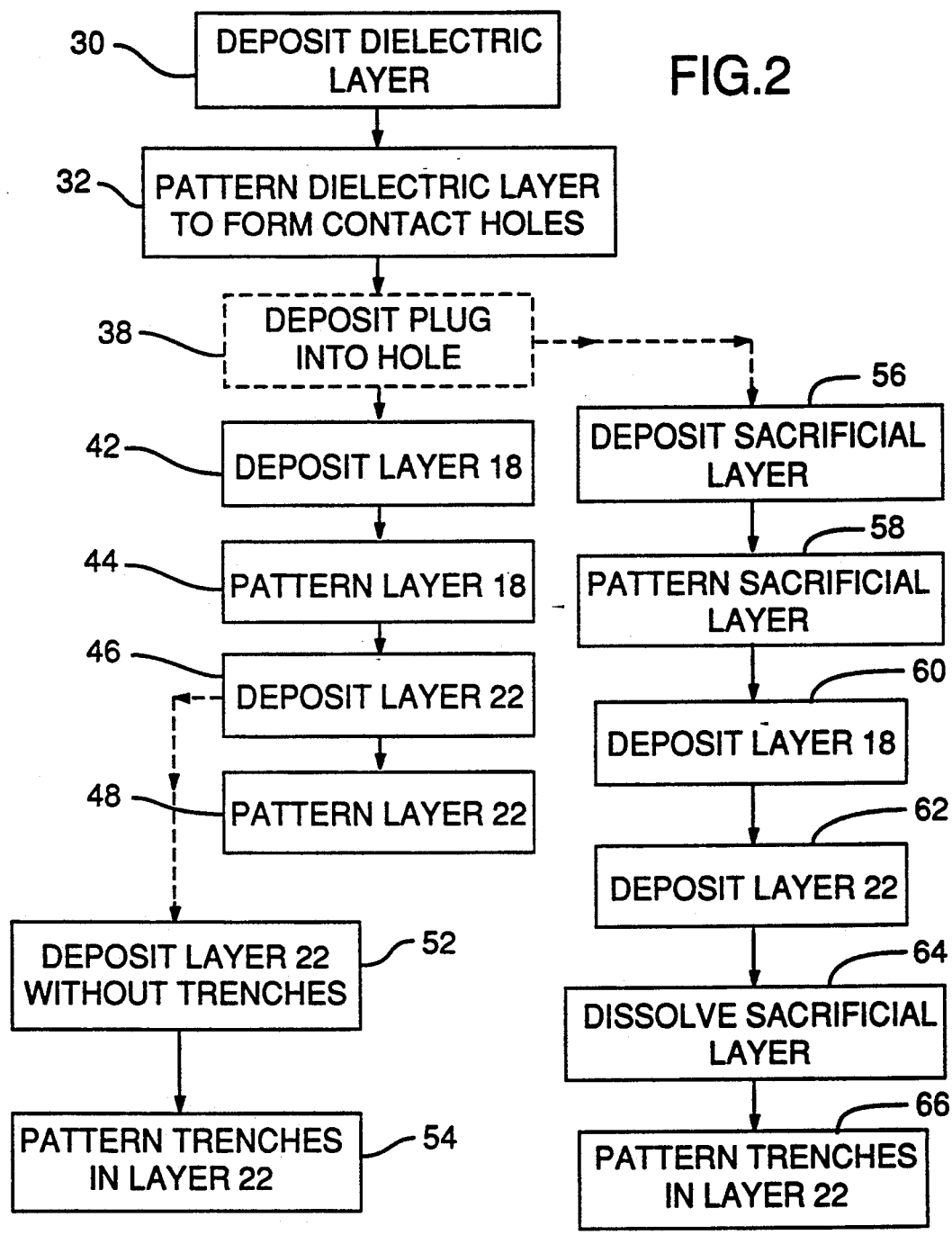

INTERCONNECT LEAD WITH STRESS JOINT

TECHNICAL FIELD

This invention relates to interconnect leads formed on semiconductor wafers and, in particular, to leads with reduced stress.

BACKGROUND OF THE INVENTION

Integrated circuit designers are continually shrinking the size of integrated circuit devices to improve speed and increase device density on a chip. As more devices are formed in a smaller area, there is less space available above the devices for the electrically conductive interconnect leads that connect the devices; therefore, thinner interconnect leads are required. However, thinner interconnect leads, especially in relatively long runs, are more prone to failure stemming from stress induced by thermal cycling during subsequent wafer processing.

Thermal cycling induces stress because of the differences between the thermal coefficient of expansion ("TCE") of the conductive lead material and that of other materials on the wafer. For example, aluminum, which is typically used as interconnect lead material, has a TCE of $230 \times 10^{-7}$ ° $C^{-1}$ and is typically deposited onto a dielectric layer of silicon dioxide, which has a TCE of only $5 \times 10^{-7}$ ° $C^{-1}$. Stress is created in the aluminum lead and the dielectric because each tends expand and contract at different rates as temperature is changed.

Thermally induced stress in thin interconnect leads can cause them to crack. Cracks either sever the electrical connection completely or reduce the current-carrying cross-sectional area of the lead, thereby producing high current densities that cause electro-migration and eventual lead failure. Thermal cycling also promotes the formation of hillocks, i.e., small mounds, in thin leads. Because hillocks protrude upward, they interfere with the deposition of subsequent layers, causing pinholes and voids. Pinholes and voids are susceptible to corrosion and can cause high local current densities that cause electro-migration and eventual failure. Hillocks can also penetrate through insulating layers and cause short circuits.

It has previously been considered that hillocks occur only when the crystal grain size of the conductor is less than the conductor width, and, therefore, that hillocks would occur less frequently as leads are made thinner. However, Pico and Bonifield, in "Thermal Hillocks on Half-Micron Aluminum Lines: The Next Reliability Issue?" *Proceedings of the Institute of Electronic and Electrical Engineers VMIC Conference*, Jun. 11-12, 1991, pp. 256-57, have demonstrated that hillocks form on leads that are smaller than the lead grain size. They reported that hillocks ranging in size from 0.5 μm to 1.3 μm are thermally induced in aluminum leads less than 0.6 μm wide and occur as frequently as once every 90 μm to 300 μm along the lead. Thus, it now appears that hillock formation will be a major problem for the thinner leads required as integrated circuits become denser.

Interconnect leads for integrated circuits are typically made by physical vapor deposition of an aluminum alloy at a uniform thickness onto an insulating layer. Hillock formation has been reduced by adding a small amount of copper to the aluminum conductor, but copper increases the resistivity of the aluminum lead, changes the etch back time, and requires a more complex deposition process.

SUMMARY OF THE INVENTION

An object of the present invention is, therefore, to provide an electrically conductive interconnect lead for a semiconductor wafer.

Another object of this invention is to provide such a lead that is thin and has reduced stress.

A further object of this invention is to provide such a lead that inhibits the formation of stress related defects, especially in long runs.

Yet another object of this invention is to provide such a lead with reduced cracking and hillock formation.

The present invention is an electrically conductive interconnect lead with reduced stress for a semiconductor wafer and a method for inhibiting the formation of stress related defects along the interconnect lead. Thermal stress, with the attendant hillock and void problems, is reduced in the interconnect lead of this invention by forming a lead having stress reduction joints.

The lead comprises a continuous, electrically conductive layer of a first thickness and a segmented, electrically conductive layer of a second thickness. The continuous layer provides electrical continuity; and discontinuities, or trenches, in the segmented layer form the stress reduction joints.

The lead is preferably formed by depositing a first conductive material of the first thickness, depositing over the first conductive material a second conductive material of the second thickness, and then removing from the second conductive material thin depthwise portions at spaced apart intervals in a transverse direction along the length of the lead. The removal of transverse depthwise portions leaves the multiple trenches that define the discontinuous conductive segments.

The continuous and segmented layers are preferably formed by physical vapor deposition of, respectively titanium-tungsten and aluminum alloys. The trenches are etched though the aluminum to the titanium-tungsten. The titanium-tungsten composing the continuous layer provides a continuous conductive pathway at the trench locations. The aluminum segments composing the segmented layer carry electrical current at positions other than the trench locations. The trenches in the segmented layer function as stress reduction joints.

Additional objects and advantages of the present invention will be apparent from the following detailed description of preferred embodiments thereof, which proceeds with reference to the accompanying drawings.

BRIEF DESCRIPTION OF THE DRAWINGS

FIG. 2 is a flow chart showing the process steps of three preferred embodiments of the method of the present invention for inhibiting defect formation in a semiconductor lead by forming the interconnect lead shown in FIG. 1.

DETAILED DESCRIPTION OF PREFERRED EMBODIMENTS

Figure 1:
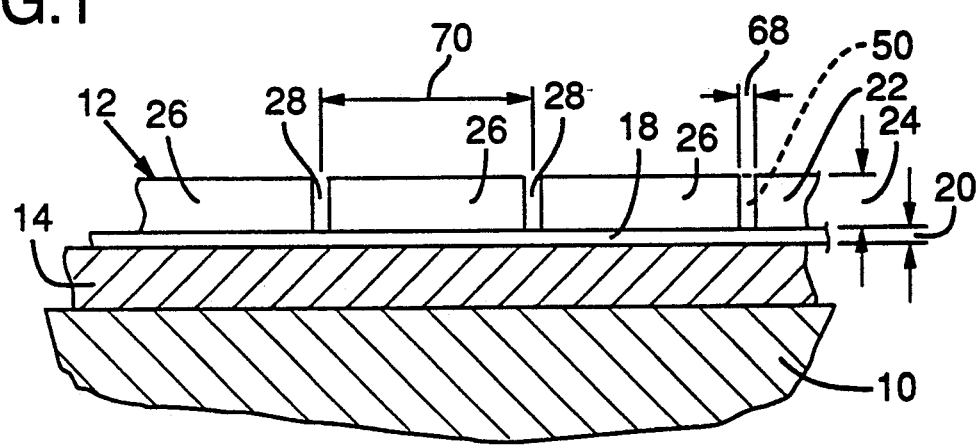
FIG. 1 is a fragmentary sectional view of a semiconductor wafer supporting on a surface thereof a dielectric layer and an interconnect lead including a continuous, electrically conductive layer and a segmented, electrically conductive layer.

FIG. 1 shows a semiconductor wafer 10 having an electrically conductive interconnect lead 12 of the present invention atop a dielectric layer 14. Lead 12 includes a continuous, electrically conductive layer 18 of a first electrically conductive material of a first thickness 20 and a segmented, electrically conductive layer 22 of a second electrically conductive material of a second thickness 24. Segmented layer 22 includes multiple discontinuous, conductive segments 26 defined by multiple depthwise discontinuities or trenches 28.

FIG. 2 illustrates three preferred embodiments of the method of the present invention for inhibiting the formation of stress-reduced defects along electrically conductive interconnect leads for a semiconductor wafer 10 of the single-crystal silicon type. The center column of FIG. 2, which includes process steps 30 through 48, represents the steps of the first preferred embodiment. The second and third preferred embodiments begin with the same steps as those of the first preferred embodiment, but depart from certain of those steps at the places indicated by dashed lines on FIG. 2. Additional steps of the second and third preferred embodiments are represented by columns of process steps to the left and right, respectively, of the column representing first preferred embodiment.

Figure 3:
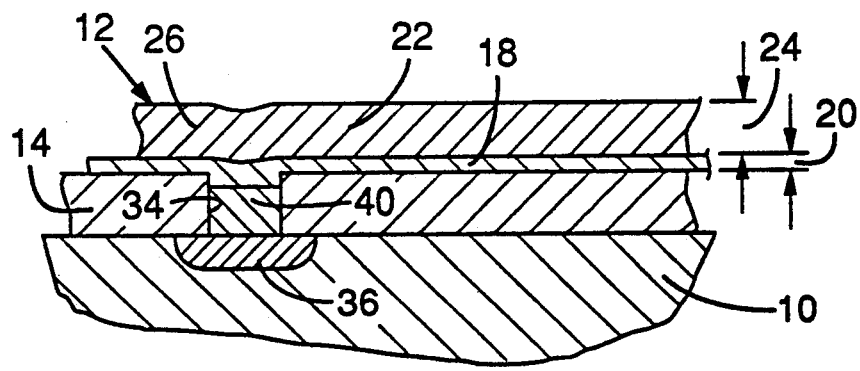
FIG. 3 is a fragmentary sectional view of an electrical contact formed between an electrically conductive layer and a semiconductor device.

With reference to FIG. 2, process step 30 indicates that dielectric layer 14 of silicon dioxide is deposited onto wafer 10 by chemical vapor deposition. Process step 32 represents the microlithographic patterning of dielectric layer 14 to create a contact hole 34 (FIG. 3) that allows formation of an electrical contact between lead 12 and a circuit device 36. Process step 38 represents an optional step that facilitates an improvement in step coverage of layer 18 by depositing a conductive plug 40 into hole 34 before depositing layer 18 over dielectric layer 14 and into hole 34. (Process step 38 is shown as a dashed box to indicate that the step is optional.)

Plug 40 can be deposited by a conventional selective deposition technique or by using a lift-off technique. The lift-off technique entails depositing a stencil layer, such as photoresist, onto dielectric layer 14 but not into hole 34, depositing a conductive material onto the stencil layer and into hole 34, and then removing the stencil layer, thereby removing the conductive material outside of hole 34 as the stencil layer is removed and leaving conductive material in hole 34 as plug 40.

Process step 42 represents the physical vapor deposition of the first electrically conductive material to form layer 18 of less than approximately 0.15 $\mu$m in thickness 20. The first electrically conductive material is preferably a refractory metal or refractory metal alloy such as ten percent titanium and ninety percent tungsten. The material chosen primarily exhibits high conductivity, ease of processing, adherence to dielectric layer 14, TCE match to dielectric layer 14, and resistance to electromigration. Process step 44 represents the conventional microlithographic or lift-off patterning of layer 18 to form desired electrical connections on the wafer.

Process step 46 represents the physical vapor deposition of the second electrically conductive material onto wafer 10 to form layer 22 over layer 18. Layer 22 is preferably of between 0.1 $\mu$m and 1.2 $\mu$m in thickness 24, and the second electrically conductive material is preferably aluminum or an aluminum alloy, such as that described in U.S. Pat. No. 4,999,160 of Doan and Lowrey.

Process step 48 indicates the high resolution microlithographic patterning of layer 22 to form electrically conductive segments 26 along the top of layer 18. In patterning step 48, the entire thickness 24 of layer 22 is removed from certain areas to leave the desired interconnect pattern atop layer 18. Segments 26 are simultaneously formed by removing multiple depthwise portions 50 of layer 22 remaining over layer 18 to leave multiple trenches 28 in the surface of and in a transverse direction to the length of lead 12.

Patterning step 48 entails use of an etchant, such as a chlorinated plasma, that selectively removes the material of which layer 22 is made, but does not significantly remove the material of which layer 18 is made. Patterning step 48 is the final step of first preferred embodiment.

In the second preferred embodiment, layer 22 is patterned twice—once using a conventional microlithographic process and once using a high resolution process. The steps of the second preferred embodiment through step 46 are identical with those of the first embodiment. The dashed line extending from process step 46 indicates that the second preferred embodiment continues with process step 52, which represents conventional microlithographic patterning of a continuous layer of the second electrically conductive material to form layer 22 on top of layer 18. Process step 54 entails using a high resolution microlithography processor to form trenches 28 in layer 22.

In the third preferred embodiment, layers 18 and 22 are patterned in one step to form the desired electrical connections on wafer 10, thereby eliminating any alignment error between the layers. In this embodiment, process steps 30, 32, and 38 are performed as previously described to deposit and pattern dielectric layer 14 and to deposit conductive plug 40 into hole 34.

The dashed line extending from process step 38 indicates that the third preferred embodiment continues with process steps 56 and 58 representing, respectively, the deposition and the patterning of a sacrificial, or stencil, layer (not shown) preferably of photoresist material. Process step 60 represents the deposition of the first electrically conductive material of layer 18 onto the stencil layer and, where the stencil layer has been removed during patterning step 58, onto dielectric layer 14 or plug 40.

Process step 62 indicates that the second electrically conductive material of layer 22 is deposited onto the material of layer 18. In this embodiment, there is no patterning step between the two depositions. Process step 64 indicates that the stencil layer is dissolved and that the first and second conductive materials previously deposited onto the stencil layer are floated off of wafer 10 as the stencil layer beneath those parts dissolves. Conductive layers 18 and 22 remain at positions where they were deposited directly onto dielectric layer 14 or plug 40, thereby forming the desired electrical connection pattern on the wafer. Process step 66 represents the high definition patterning of layer 22 to remove depthwise sections 50, leaving trenches 28 that define separate segments 26.

Patterning steps 48, 52, and 66 preferably entail a high resolution microlithography technique using phase-shift technology to form trenches 28 of between 0.01 $\mu$m and 0.5 $\mu$m in width. Although the resistivity of lead 12 is increased because of the small current-carrying cross section of lead 12 at trenches 28, the overall increase in resistance is minimized by forming trench 28 with a relatively narrow width 68.

Trenches 28 function as stress reduction joints. The titanium-tungsten alloy composing layer 18 has a TCE of approximately $40 \times 10^{-7}$ °C$^{-1}$. This value is sufficiently close to $5 \times 10^{-7}$ °C$^{-1}$, the TCE of silicon dioxide composing dielectric layer 14, so layers 14 and 18 create little stress as they tend to expand and contract during temperature changes at the titanium-tungsten/silicon dioxide interface. The TCE of the aluminum alloy that composes layer 22 is approximately $230 \times 10^{-7}$ °C$^{-1}$, which is relatively mismatched to the TCE of the titanium-tungsten layer, but trenches 28 allow the aluminum to expand or contract, thereby reducing the stress caused during thermal cycling by the mismatched TCEs.

Trenches 28 are formed as stress joints at intervals 70 along the lead 12. The preferred trench 28 spacing interval 70 for reducing or eliminating cracking and hillock formation resulting from thermal stress is between 100 µm and 1,000 µm. At the location of trench 28, the entire current in lead 12 is carried by layer 18, resulting in relatively high current densities. The material that composes layer 18 is, therefore, chosen to withstand such high current density. Interval 70 and trench width 68 are chosen such that the increase in resistivity is within acceptable limits.

The resistance, R, of a length, l, of lead 12 having a quantity, n, of trenches 28 can be approximated by adding the resistance of each of the n trenches 28 and the resistance of the untrenched portions of lead 12 as follows:

$$R = n\rho_i w_i / t_i w + (l - nw_i)\rho_l / tw,$$

where $\rho_i$ is the resistivity of the first conductive material composing layer 18, $w_i$ is the width 68 of trench 28, $t_i$ is the first thickness 20, w is the width of lead 12, $\rho_l$ is the resistivity of lead 12 without trenches 28, and t is the thickness of lead 12, i.e., the sum of thicknesses 20 and 24.

The first term represents the resistance of the trenches 28 and the second term represents the resistance of the untrenched portions of lead 12. This equation is similar to that used by Castaño and Mais to predict changes in lead resistance caused by voids in "Physical Analysis of Electromigration Damage Under Bidirectional (BC) and Pulsed DC (PDC) Conditions" *Proceedings of the Institute of Electronic and Electrical Engineers VMIC Conference,* Jun. 11–12, 1991, pp. 258–61. The second term may also be calculated by combining the parallel resistances of layers 18 and 22 along the untrenched lengths of lead 12. Skilled persons will recognize that $\rho_l$, the resistivity of lead 12 without trenches 28, depends upon the resistivity of the chosen first and second electrically conductive materials and thicknesses 20 and 24.

It will be obvious that many changes may be made to the above-described details of the invention without departing from the underlying principles thereof. For example, continuous layer 18 and segmented layer 22 could be formed from a single deposited layer. In this case, segmented layer 22 is formed by etching trenches 28 partly through a single conductive layer to form layers 18 and 22, and thicknesses 20 and 24 are determined by the etch depth.

Other materials can be substituted for those used in the preferred embodiment, and other processes may be used to deposit and etch the layers. The patterning steps can be performed by conventional or lift-off processes. High definition microlithography processes of steps 48, 54, and 66 could use, for example, deep ultraviolet or X-rays in place of or in conjunction with phaseshift technology.

It is also apparent that the invention is not limited to an interconnect lead 12 that makes direct contact with circuit device 36 through contact hole 34; the invention can be applied to any interconnect lead 12 at any metallization level on wafer 10. Skilled persons will recognize that the interaction between subsequent layers and trenches 28 will be a factor to be considered when using lead 12. The scope of the present invention should, therefore, be determined only by the following claims.

I claim:

1. An electrically conductive interconnect lead for a semiconductor wafer, comprising:
   a continuous, electrically conductive layer of a first thickness; and
   a segmented, electrically conductive layer of a second thickness, the segmented layer having segments separated by discontinuities that form joints that reduce stress in the lead.

2. The interconnect lead of claim 1, in which the continuous layer includes a refractory metal.

3. The interconnect lead of claim 2, in which the refractory metal includes a tungsten-titanium alloy.

4. The interconnect lead of claim 1, in which the segmented layer includes aluminum.

5. The interconnect lead of claim 1, in which the discontinuities are spaced apart at intervals of less than 90 µm.

6. The interconnect lead of claim 1, in which the discontinuities between segments are less than 0.2 µm wide.

7. A method for inhibiting the formation of stress-related defects along an electrically conductive interconnect lead for a semiconductor wafer, the method comprising:
   forming a continuous, electrically conductive layer of a first thickness; and
   forming a segmented, electrically conductive layer of a second thickness, the segmented layer having segments separated by discontinuities that form joints that reduce stress in the lead.

8. The method of claim 7, in which the step of forming the segmented layer includes depositing an electrically conductive material and removing multiple depthwise portions thereof.

9. The method of claim 7 in which the step of forming the continuous layer includes depositing a first electrically conductive material and the step of forming the segmented layer includes depositing a second electrically conductive material.

10. The method of claim 9, in which the step of forming the segmented layer includes removing depthwise portions of the second electrically conductive material.

* * * * *